(12) United States Patent
Kobayashi et al.

(10) Patent No.: US 11,386,546 B2
(45) Date of Patent: Jul. 12, 2022

(54) SYSTEM FOR CREATING LEARNED MODEL FOR COMPONENT IMAGE RECOGNITION, AND METHOD FOR CREATING LEARNED MODEL FOR COMPONENT IMAGE RECOGNITION

(71) Applicant: FUJI CORPORATION, Chiryu (JP)

(72) Inventors: Takahiro Kobayashi, Chiryu (JP); Shuichiro Kito, Toyota (JP); Yuta Yokoi, Kariya (JP)

(73) Assignee: FUJI CORPORATION, Chiryu (JP)

( * ) Notice: Subject to any disclaimer, the term of this patent is extended or adjusted under 35 U.S.C. 154(b) by 78 days.

(21) Appl. No.: 16/963,988

(22) PCT Filed: Feb. 9, 2018

(86) PCT No.: PCT/JP2018/004555
§ 371 (c)(1),
(2) Date: Jul. 22, 2020

(87) PCT Pub. No.: WO2019/155593
PCT Pub. Date: Aug. 15, 2019

(65) Prior Publication Data
US 2021/0035284 A1 Feb. 4, 2021

(51) Int. Cl.
*G06K 9/00* (2022.01)
*G06T 7/00* (2017.01)
*G06K 9/62* (2022.01)

(52) U.S. Cl.
CPC .......... *G06T 7/0008* (2013.01); *G06K 9/6259* (2013.01); *G06T 7/001* (2013.01);
(Continued)

(58) Field of Classification Search
CPC .................. G06T 7/0008; G06T 7/001; G06T 2207/20081; G06T 2207/30148; G06K 9/6259; G06K 9/62; H05K 13/08
See application file for complete search history.

(56) References Cited

U.S. PATENT DOCUMENTS 10,380,457 B2 * 8/2019 Amano .................. H05K 13/04
2003/0191732 A1 10/2003 Lee et al.
(Continued)

FOREIGN PATENT DOCUMENTS

JP 2008-130865 A 6/2008
JP 2009-54821 A 3/2009
(Continued)

OTHER PUBLICATIONS

Modolo, D., et al., "Learning Sematic Part-Based Models from Google Images", Computer Science, Medicine, IEEE Transactions on Pattern Analysis and Machine Intelligence, Jul. 6, 2017, Retrieved from the Internet: https://arxiv.org/abs/1609.03140.pdf, pp. 1-8.
(Continued)

*Primary Examiner* — Samir A Ahmed
(74) *Attorney, Agent, or Firm* — Oblon, McClelland, Maier & Neustadt, L.L.P.

(57) ABSTRACT

A system for creating a learned model for component image recognition, the learned model being used when performing image recognition of a component that is picked up by a suction nozzle of a component mounter or a component that is mounted on a circuit board, serving as an imaging target, by imaging the imaging target with a camera, and the system includes a computer configured to acquire a reference-learned model to be used for image recognition of a reference component. The computer collects sample component images for each type of a component having a predetermined similarity with the reference component, and creates a component-by-component learned model to be used for image recognition of the component for each type of the component by adding the sample component image for each type of the component, as teacher data of the reference-learned model, and re-learning the added sample component image.

9 Claims, 4 Drawing Sheets

(52) U.S. Cl.
CPC ............... *G06T 2207/20081* (2013.01); *G06T 2207/30148* (2013.01)

(56) References Cited

U.S. PATENT DOCUMENTS

| | | | |
|---|---|---|---|
| 2013/0114882 A1 | 5/2013 | Kawata | |
| 2018/0124963 A1* | 5/2018 | Kotani | H05K 13/08 |
| 2018/0276501 A1* | 9/2018 | Yamada | G06K 9/2027 |
| 2018/0314918 A1* | 11/2018 | Amano | G06K 9/6263 |
| 2019/0130216 A1* | 5/2019 | Tomioka | G06K 9/6267 |
| 2019/0274238 A1* | 9/2019 | Sugiyama | G06T 7/70 |
| 2019/0297760 A1* | 9/2019 | Kikuchi | H05K 13/0409 |
| 2019/0335633 A1* | 10/2019 | Jung | G01B 11/24 |
| 2020/0045865 P1* | 2/2020 | Lovengreen Ferreira | Plt./216 |

FOREIGN PATENT DOCUMENTS

| | | |
|---|---|---|
| JP | 2013-100996 A | 5/2013 |
| JP | 2014-27064 A | 2/2014 |
| WO | WO 2017/081736 A1 | 5/2017 |

OTHER PUBLICATIONS

International Search Report dated May 1, 2018 in PCT/JP2018/004555 filed on Feb. 9, 2018, 2 pages.

\* cited by examiner

SYSTEM FOR CREATING LEARNED MODEL FOR COMPONENT IMAGE RECOGNITION, AND METHOD FOR CREATING LEARNED MODEL FOR COMPONENT IMAGE RECOGNITION

TECHNICAL FIELD

The present specification discloses a technique related to a system for creating a learned model for component image recognition and a method for creating a learned model for component image recognition, the learned model being used when performing image recognition by imaging the imaging target with a camera, the imaging target being a component that is picked up by a suction nozzle of a component mounter, or a component that is mounted on a circuit board.

BACKGROUND ART

In a pickup orientation of the component picked up by the suction nozzle of the component mounter, the component is horizontally picked up, if the pickup orientation thereof is normal pickup, but for some reason, abnormal pickup may occur in which the component is picked up in an abnormal orientation such as oblique. Since such abnormal pickup causes component mounting failures, in the conventional art, the component mounter is equipped with a camera for imaging the component picked up by the suction nozzle, it is determined whether the pickup orientation of the component is normal pickup or abnormal pickup by processing the image captured by the camera, and thereby the component determined as abnormal pickup is discarded, and only the component determined as normal pickup is mounted on the circuit board.

In the general image processing in the related art, normal pickup/abnormal pickup is determined using the image processing component shape data including the size and the like of the component, but when the component picked up by the suction nozzle is a minute component, the determination of normal pickup/abnormal pickup may be difficult in the image processing using image processing component shape data in the related art.

Therefore, as disclosed in Patent Literature 1 (JP-A-2008-130865), there is a system in which a learned model for determining normal pickup/abnormal pickup is created in advance by using a machine learning method such as a neural network, a component image captured by a camera of a component mounter during production is processed, and normal pickup/abnormal pickup is determined using the learned model.

PATENT LITERATURE

Patent Literature 1: JP-A-2008-130865

SUMMARY OF THE INVENTION

Technical Problem

For example, even components having the same electrical specifications may vary in size, color, material, manufacturing company, manufacturing lot, or the like, and those differences may bring about differences in the image recognition result. However, before starting production, if grouping is made such as by subdividing the types of components having the same electrical specifications by size, color, material, manufacturing company, manufacturing lot, and the like, so as to create a learned model by a machine learning method for all of the types, a large number of learned models have to be created, which requires many efforts and much time for creating such learned models.

Therefore, for components of a type having similarity to, in shape and so on, the components for which the learned models have already been created in advance, there is a case where the normal pickup/abnormal pickup is determined using the existing learned models, but in such a case, the determination accuracy expected during production may not be obtained. In this case, it is necessary to quickly create a learned model specialized for the component, but it takes effort and time to create a learned model by the method in the conventional art from the beginning.

Solution to Problem

In order to solve the above-mentioned problem, there is provided a system for creating a learned model for component image recognition, the learned model being used when performing image recognition by imaging an imaging target with a camera, the imaging target being a component that is picked up by a suction nozzle of a component mounter, or a component that is mounted on a circuit board, the system comprising, the system including: a computer configured to acquire a reference-learned model to be used for image recognition of a reference component, in which the computer collects sample component images for each type of a component having a predetermined similarity with the reference component, and creates a component-by-component learned model to be used for image recognition of the component for each type of the component by adding the sample component image for each type of the component, as teacher data of the reference-learned model, and re-learning the added sample component image.

In short, for a component having a predetermined similarity with a reference component for which a reference-learned model has been created, sample component images are collected for each type of the component, and a component-by-component learned model to be used for image recognition of the component is created for each type of the component by adding the sample component image for each type of the component, as teacher data of the reference-learned model, and re-learning the added sample component image. In this way, it is possible to relatively easily create, from the reference-learned model, a component-by-component learned model to be used for image recognition of a component having a predetermined similarity with the reference component.

DESCRIPTION OF EMBODIMENTS

Figure 1:
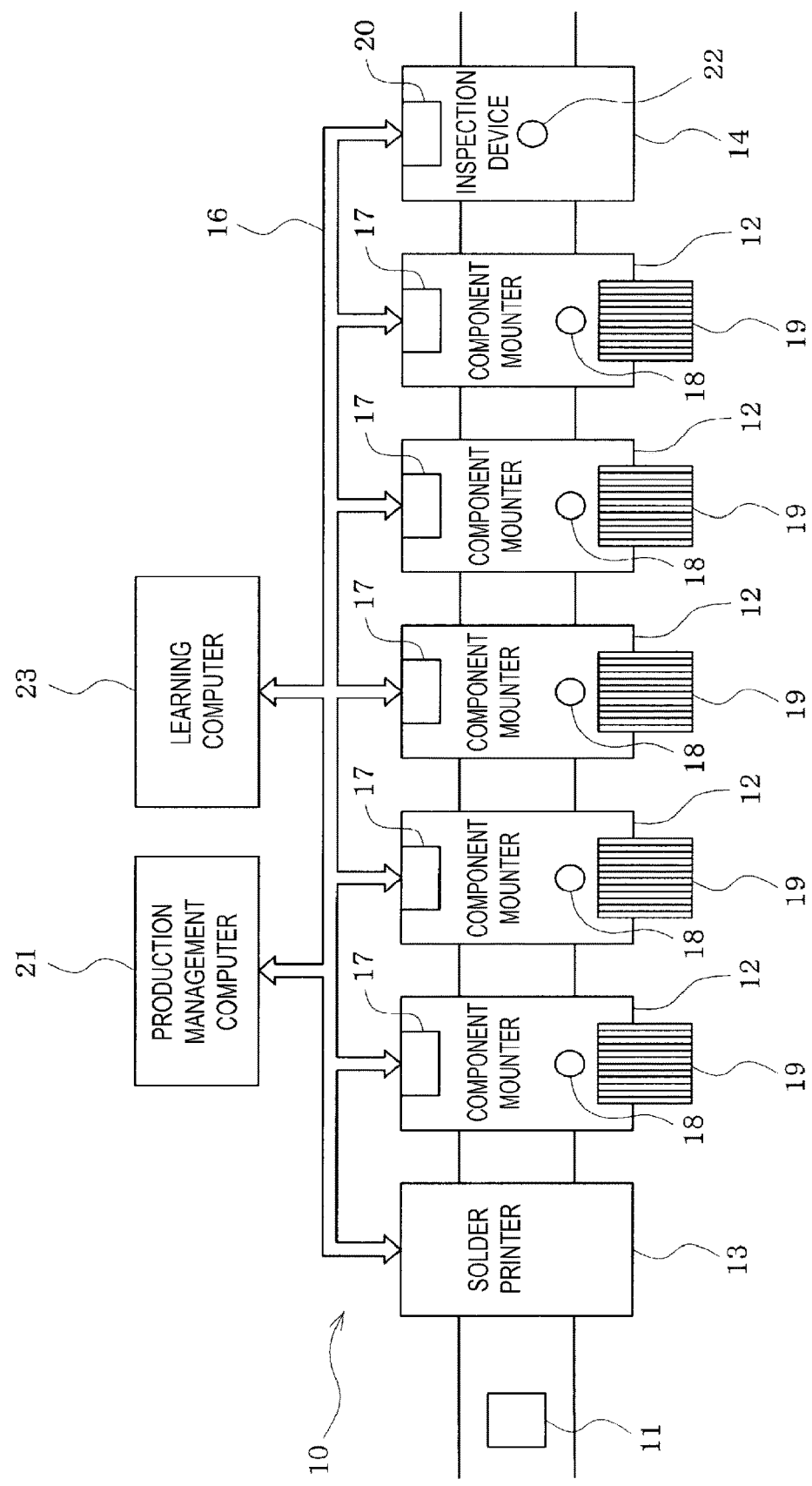
FIG. 1 is a block diagram showing an example of a configuration of a component mounting line of an embodiment.

Hereinafter, an embodiment will be described. First, the configuration of component mounting line 10 will be described with reference to FIG. 1.

Component mounting line 10 is configured by arranging one or more component mounters 12 and mounting related devices such as solder printer 13 and a flux coating device (not shown) along the conveyance direction of circuit board 11. Inspection device 14 is installed on the board unloading side of component mounting line 10 to inspect the good or bad quality of the mounted state of each component mounted on circuit board 11.

Figure 2:
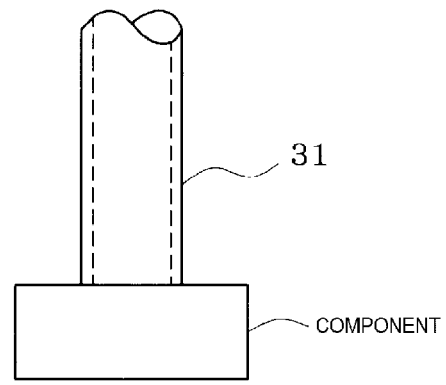
FIG. 2 is a front view for describing normal pickup.
Figure 3:
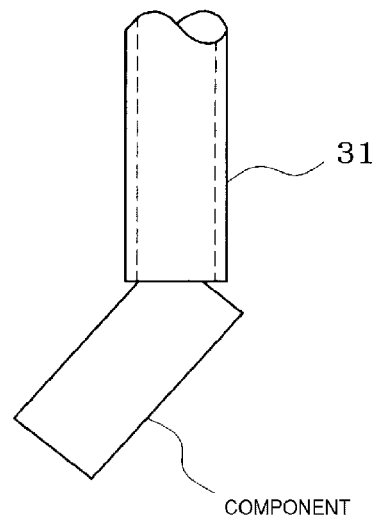
FIG. 3 is a front view for describing oblique pickup.

Each component mounter 12, solder printer 13, and inspection device 14 of component mounting line 10 are connected to production management computer 21 via network 16 so as to be able to communicate with production management computer 21, and the production of component mounting line 10 is managed by production management computer 21. Control device 17 of each component mounter 12 is mainly configured by one or more computers (CPU), and, according to a production job (production program) transferred from production management computer 21; causes a mounting head (not shown) to move along a path of component pickup position→component imaging position→component-mounted position; causes the component (see FIGS. 2 and 3) supplied from feeder 19 to be picked up by suction nozzle 31 (see FIGS. 2 and 3) of the mounting head and causes component imaging camera 18 to image the component from below; processes the captured image by using an image processing function of control device 17 of component mounter 12; and determines whether a pickup orientation of the component is normal pickup (see FIG. 2) or abnormal pickup (see FIG. 3) by using a learned model to be described later. As a result, if it is determined that the pickup orientation is abnormal pickup, the component is discarded in a predetermined disposal box (not shown), and if it is determined that the pickup orientation is normal pickup, a predetermined number of components are mounted on circuit board 11 by repeating the operation of measuring pickup positions X and Y and an angle θ of the component, correcting the deviation of the positions X and Y or the angle θ of the component, and mounting the component on circuit board 11.

Control device 20 of inspection device 14 is mainly configured by one or more computers (CPU), and causes inspecting camera 22 to image the mounted state of each component on the loaded circuit board 11 from above; processes the captured image, recognizes the presence or absence of each component on circuit board 11 and the mounted state such as a mounted position deviation, and inspects whether each component fails to be mounted (inspection failed) based on the recognition result. At this time, the presence or absence of each component on circuit board 11 may be determined using the learned model to be described later.

Network 16 of component mounting line 10 is connected to learning computer 23 that collects and learns teacher data (sample component images) to be used to create a reference-learned model or a component-by-component learned model to be described later.

Control device 17 of each component mounter 12 executes a component pickup orientation determination program in FIG. 4, which will be described later, during production, thereby selecting a learned model according to the type of components picked up by suction nozzle 31, determining whether the pickup orientation of the component is normal pickup or abnormal pickup from the processing result of the captured image of the component, transferring the captured image in which determination is made as the normal pickup to learning computer 23 as a sample component image of the normal pickup, and transferring the captured image in which determination is made as the abnormal pickup to learning computer 23 as a sample component image of the abnormal pickup.

On the other hand, learning computer 23 executes a component-by-component learned model creation program in FIG. 5, which will be described later, thereby classifying and collecting, for each type of the component, the sample component images of the normal pickup/abnormal pickup transferred from control device 17 of each component mounter 12, acquiring information on the inspection result of inspection device 14 to calculate a mounting failure occurrence rate for each type of the component, creating a component-by-component learned model to be used for image recognition of the component by adding the sample component image of the normal pickup/abnormal pickup collected for the component, as teacher data of the reference-learned model, and re-learning the added sample component image when the component whose mounting failure occurrence rate exceeds a determination threshold exists, and transferring the component-by-component learned model to control device 17 of each component mounter 12. As the re-learning method, a machine learning method such as a neural network or a support vector machine may be used.

Here, the reference-learned model is a learned model to be used for image recognition of a reference component, which may be created by learning computer 23 collecting sample component images of normal pickup/abnormal pickup of the reference component, as teacher data, and learning the sample component images by machine learning such as a neural network or a support vector machine, or which may be created by an external computer and loaded into learning computer 23. The reference component is not limited to a specific component, and a component for which a learned model has been created in advance may be used as the "reference component".

Control device 17 of each component mounter 12 stores the reference-learned model and the component-by-component learned model transferred from learning computer 23 in a storage device (not shown) in association with the type of the component to perform image recognition using the models. At that time, the reference-learned model or the component-by-component learned model is included and stored in the image processing component shape data prepared for each type of the component. In the following description, simply referring to a "learned model" includes both a reference-learned model and a component-by-component learned model. The image processing component shape data is data representing appearance features such as the size of the body portion of the component, and the position, the size, the pitch, and the number of terminals such as bumps and leads, and is used to determine the type of the image-recognized component or to measure the pickup position, the angle, or the like of the component. The process of including the learned model created for each type of the component in the image processing component shape data prepared for each type of the component may be performed by control device 17 of each component mounter 12 or may be performed by learning computer 23. Alternatively, the learned model may be transferred from learning computer 23 to production management computer 21, production management computer 21 may perform a process of including the learned model in the image processing component shape data, and the image processing component shape data including the learned model may be transferred from production management computer 21 to control device 17 of each component mounter 12.

When a learned model to be used for image recognition of the component picked up by suction nozzle 31 exists among the learned models stored for each type of the component, control device 17 of each component mounter 12 selects the learned model for the component and performs image recognition of the component, but when a learned model for the component does not exist among the learned models stored for each type of the component, control device 17 of each component mounter 12 regards a component having a predetermined similarity with the component picked up by suction nozzle 31 from among the components in which the learned models exist as a "reference component", and uses the learned model for the reference component as the "reference-learned model" to perform image recognition of the component picked up by suction nozzle 31. At this time, the learned model for the reference component may be a component-by-component learned model created from the reference-learned model for other components, and in this case, the component-by-component learned model created from the reference-learned model for other components is used as the reference-learned model.

In this case, the component having a predetermined similarity is, for example, a component having the same or similar shape even if any of the size, color, material, manufacturing company, manufacturing lot, and the like of the components is different. If there is a predetermined similarity between components, even if the image recognition of a second component is performed using the learned model for a first component, the image recognition can be performed with a certain degree of accuracy (generally more than the minimum accuracy required for production). In other words, if the image recognition of a second component can be performed with a certain degree of accuracy using the learned model for a first component, it can be said that these two components have a predetermined similarity.

Next, flows of processes of the component pickup orientation determination program in FIG. 4 and the component-by-component learned model creation program in FIG. 5 will be described.

[Component Pickup Orientation Determination Program]

Figure 4:
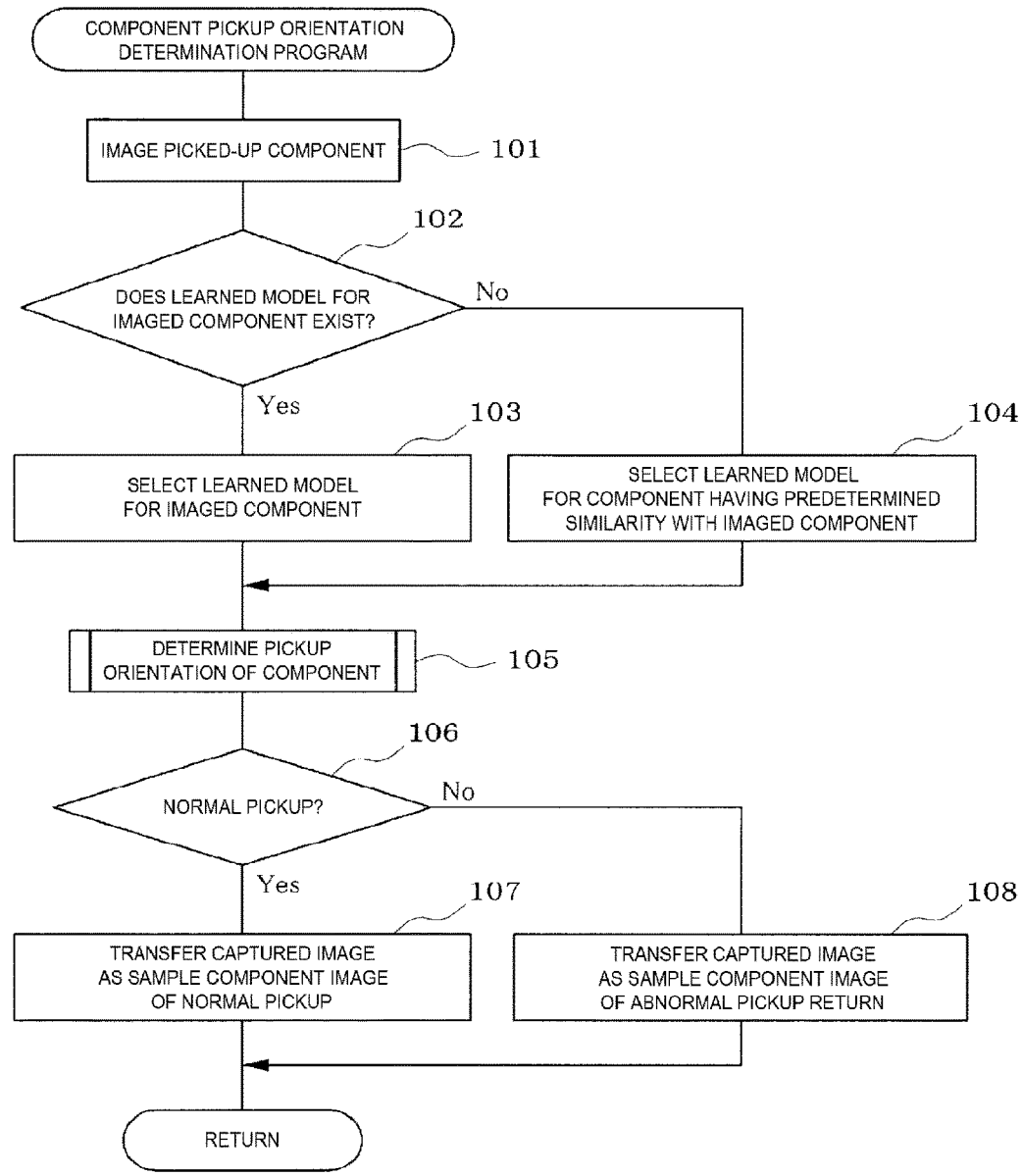
FIG. 4 is a flowchart showing a flow of a process of a component pickup orientation determination program.

The component pickup orientation determination program in FIG. 4 is executed by control device 17 of each component mounter 12 each time component imaging camera 18 images the component picked up by suction nozzle 31 of each component mounter 12 during the production.

When starting this program, control device 17 of each component mounter 12 first causes component imaging camera 18 to image the component picked up by suction nozzle 31 in step 101 and causes the captured image to be loaded. Subsequently, the process proceeds to step 102, and it is determined whether the learned model for the imaged component exists in the learned models stored in the storage device (not shown) for each type of the component, and when the learned model for the imaged component exists, the process proceeds to step 103, and the learned model for the imaged component is selected as the learned model to be used for the image recognition this time.

On the other hand, when the learned model for the imaged component does not exist in the learned models stored in the storage device for each type of the component, the process proceeds to step 104, and the learned model for the component having a predetermined similarity with the imaged component is selected from among the learned models stored in the storage device for each type of the component, as the learned model to be used for the image recognition this time.

As described above, after selecting the learned model to be used for the image recognition this time, the process proceeds to step 105, the captured image of this time is processed by the image processing function of control device 17, and it is determined whether the pickup orientation of the imaged component is normal pickup (see FIG. 2) or abnormal pickup (see FIG. 3) by using the selected learned model.

Subsequently, the process proceeds to step 106, and it is determined whether the determination result of the pickup orientation is normal pickup, and if it is normal pickup, the process proceeds to step 107, the captured image of this time is transferred to learning computer 23 as a sample component image of normal pickup, and this program ends. On the other hand, if the determination result of the pickup orientation is not normal pickup but abnormal pickup, the process proceeds to step 108, the captured image of this time is transferred to learning computer 23 as a sample component image of abnormal pickup, and this program ends. As a result, learning computer 23 collects the sample component images of normal pickup/abnormal pickup from control device 17 of each component mounter 12.

Control device 17 of each component mounter 12 may temporarily collect the sample component images of normal pickup/abnormal pickup. In this case, every time control device 17 of each component mounter 12 collects a predetermined number of sample component images (or every time the sample component images are collected for a predetermined period of time), the sample component images collected so far may be collectively transferred to learning computer 23, or every time a sample component image transfer request is output from learning computer 23, the sample component images collected so far by control device 17 of each component mounter 12 may be collectively transferred to learning computer 23. Alternatively, production management computer 21 may collect sample component images from control device 17 of each component mounter 12, and transfer the sample component images from production management computer 21 to learning computer 23. In any method, learning computer 23 can finally collect the sample component images.

[Component-by-Component Learned Model Creation Program]

Figure 5:
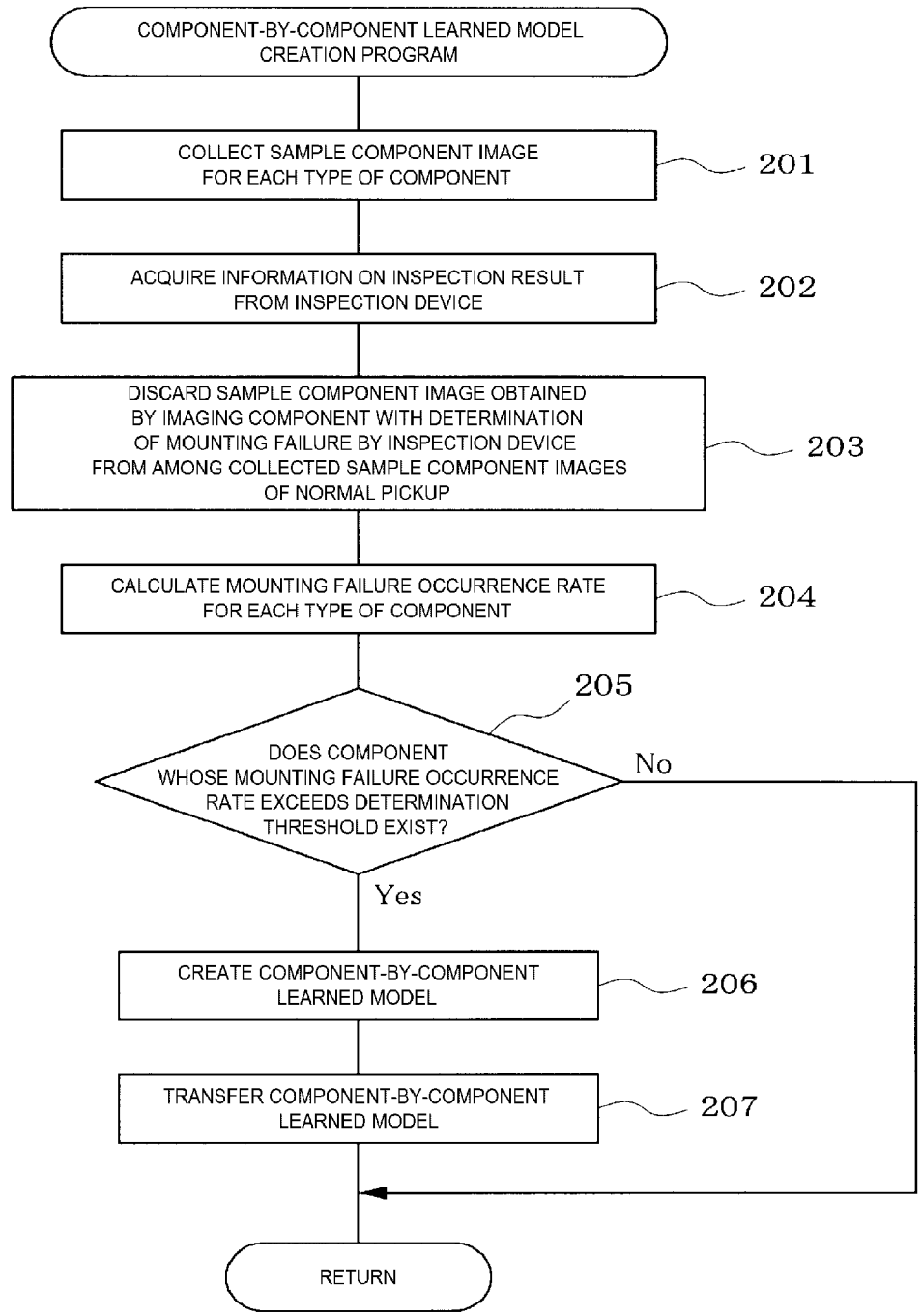
FIG. 5 is a flowchart showing a flow of a process of a component-by-component learned model creation program.

The component-by-component learned model creation program in FIG. 5 is repeatedly executed by learning computer 23 at a predetermined cycle. When learning computer 23 starts this program, first, in step 201, sample component images of normal pickup/abnormal pickup are collected for each type of the component from control device 17 of each component mounter 12 or production management computer 21. Then, in the next step 202, information on the inspection result is acquired from inspection device 14.

Subsequently, the process proceeds to step 203, and the sample component image obtained by imaging the component that is determined as a mounting failure by inspection device 14 is discarded from among the collected sample component images of normal pickup. This is because, even if it is determined that normal pickup is performed, there is a possibility that the component that is determined as a mounting failure by inspection device 14 is actually abnormal pickup. The process of step 203 may performed by control device 17 of each component mounter 12 or production management computer 21, and only the image obtained by imaging the component that is not determined as a mounting failure by inspection device 14 may be collected by learning computer 23 as a sample component image of normal pickup.

Subsequently, the process proceeds to step 204, and a mounting failure occurrence rate is calculated for each type of the component based on the information on the inspection result acquired from inspection device 14. Subsequently, the process proceeds to step 205, and it is determined whether a component whose calculated mounting failure occurrence rate exceeds a predetermined determination threshold exists, and when a component whose mounting failure occurrence rate exceeds a determination threshold does not exist, it is determined that the accuracy of image recognition using the selected learned model is secured (it is not necessary to create the component-by-component learned model), and this program ends.

In contrast, when a component whose mounting failure occurrence rate exceeds a determination threshold exists, it is determined that the accuracy of image recognition using the selected learned model is not secured for the component (it is necessary to create the component-by-component learned model), the process proceeds to step 206, and a component-by-component learned model for the component is created by adding the sample component image of the normal pickup/abnormal pickup collected for the component, as teacher data of the reference-learned model used for image recognition of the component, and re-learning the added sample component image. Subsequently, the process proceeds to step 207, the created component-by-component learned model is transferred to control device 17 of each component mounter 12, and this program ends. As a result, control device 17 of each component mounter 12 becomes a state in which image recognition can be performed using the component-by-component learned model transferred from learning computer 23.

According to the present embodiment described above, for the component having a predetermined similarity with the reference component for which the reference-learned model has been created, since sample component images are collected for each type of the component, and a component-by-component learned model to be used for image recognition of the component for each type of the component is created by adding the sample component image for each type of the component, as teacher data of the reference-learned model, and re-learning the added sample component image, it is possible to relatively easily create a component-by-component learned model to be used for image recognition of the component having a predetermined similarity with the reference component from the reference-learned model, and to reduce the effort and time required for the operation of creating a learned model.

Moreover, in the present embodiment, since a component-by-component learned model created for each type of the component is included in image processing component shape data prepared for each type of the component, even in component mounters of other component mounting lines that can use the image processing component shape data, similar image recognition using the component-by-component learned model can be performed, which has the advantage of improving and stabilizing production quality.

However, the component-by-component learned model may be managed independently without being associated with the image processing component shape data.

Further, in the present embodiment, since the component picked up by suction nozzle 31 of each component mounter 12 during the production is imaged by component imaging camera 18, the image is processed to determine whether the pickup orientation of the component is normal pickup or abnormal pickup, the captured image that is determined as normal pickup is collected as a sample component image of normal pickup, and the captured image that is determined as abnormal pickup is collected as a sample component image of abnormal pickup, it is possible to collect the image captured by component imaging camera 18 during the production as a sample component image of normal pickup/abnormal pickup, and to save the effort required for the operation of collecting the sample component image.

However, the method of collecting the sample component images is not limited to only a method of collecting sample component images during production, for example, before the start of production, the component of normal pickup and the component of abnormal pickup that are picked up by suction nozzle 31 of component mounter 12 may be imaged by component imaging camera 18, and the captured images may be collected as sample component images of normal pickup/abnormal pickup. Alternatively, a dedicated imaging device for imaging sample component images may be used to collect the sample component images of normal pickup/abnormal pickup imaged by the imaging device. When a dedicated imaging device is used, it is possible to collect a sample component image of normal pickup/abnormal pickup even before the start of the production, during the production, or after the end of the production.

In the present embodiment, when a component whose mounting failure occurrence rate exceeds a predetermined determination threshold is generated during production, a component-by-component learned model for the component is created by adding the sample component image of the normal pickup/abnormal pickup collected for the component, as teacher data of the reference-learned model used for image recognition of the component, and re-learning the added sample component image, and the component-by-component learned model is transferred to control device 17 of each component mounter 12, so that every time a component whose mounting failure occurrence rate exceeds a predetermined determination threshold is generated during production, it is possible to create a component-by-component learned model to be used for image recognition of the component, and it is possible to improve the accuracy of image recognition of the component during production and to reduce the mounting failure occurrence rate.

However, the creation of the component-by-component learned model may be performed before the start of the production or after the end of the production. Alternatively, the component-by-component learned model may be created at the time when the number of collected sample component images of normal pickup/abnormal pickup exceeds a predetermined number.

The learned model of the present embodiment is a learned model for determining whether the pickup orientation of the component picked up by suction nozzle 31 is normal pickup or abnormal pickup, but may be a learned model for determining the presence or absence of the component picked up by suction nozzle 31. In this case, an image captured by component imaging camera 18 in a state where a component picked up by suction nozzle 31 exists is collected as a sample component image with a component, and an image captured by component imaging camera 18 in a state where a component picked up by suction nozzle 31 does not exist is collected as a sample component image without a component, and thereby a component-by-component learned model for the component may be created for each type of the component by adding the sample component image with/without a component classified for each type of the component, as teacher data of a reference-learned model used for image recognition of the component, and re-learning the added sample component image. Also in this case, the collection of the sample component images may be performed using a dedicated imaging device.

There is a case where inspection device 14 inspects the presence or absence of the component on circuit board 11 by using a learned model for determining the presence or absence of the component mounted on circuit board 11. In this case, control device 20 of inspection device 14 causes inspecting camera 22 to image the mounted state of each loaded component on circuit board 11, processes the captured image, inspects the presence or absence of each component on circuit board 11 by using a learned model, collects the captured image determined to have a component as a sample component image with a component, and collects the captured image determined to have no component as a sample component image without a component, and thereby a component-by-component learned model for the component may be created for each type of the component by adding the sample component image with/without a component classified for each type of the component, as teacher data of a reference-learned model used for image recognition of the component, and re-learning the added sample component image. Also in this case, the collection of the sample component images may be performed using a dedicated imaging device.

In addition, it is needless to say that the present invention can be implemented by changing the configuration of component mounting line 10, changing the processing contents and the processing order of the respective programs of FIGS. 4 and 5 as appropriate, and the like within a range not deviating from the gist.

REFERENCE SIGNS LIST

10 . . . component mounting line; 11 . . . circuit board; 12 . . . component mounter, 14 . . . inspection device; 17 . . . control device of component mounter; 18 . . . component imaging camera; 19 . . . feeder; 20 . . . control device of inspection device, 21 . . . production management computer; 22 . . . inspecting camera; 23 . . . learning computer; 31 . . . suction nozzle

The invention claimed is:

1. A system for creating a learned model for component image recognition, the learned model being used when performing image recognition by imaging an imaging target with a camera, the imaging target being a component that is picked up by a suction nozzle of a component mounter, or a component that is mounted on a circuit board, the system comprising:
a computer configured to acquire a reference-learned model to be used for image recognition of a reference component,
wherein the computer is configured to
collect sample component images for each type of a component having a predetermined similarity with the reference component,
obtain information of an inspection result acquired from an inspection device,
calculate a failure occurrence rate for each type of the component based on the information of the inspection result,
when the failure occurrence rate exceeds a predetermined threshold, create a component-by-component learned model to be used for image recognition of the component for each type of the component, the component-by-component learned model being created by adding the sample component image for each type of the component as teacher data of the reference-learned model, and re-learning the added sample component image.

2. The system for creating a learned model for component image recognition according to claim 1, wherein the component-by-component learned model created for each type of the component by the computer is included in image processing component shape data prepared for each type of the component.

3. The system for creating a learned model for component image recognition according to claim 1, wherein the component having a predetermined similarity with the reference component is a component having the same or similar shape even if any of a size, color, material, manufacturing company, and manufacturing lot of the component is different from the reference component.

4. The system for creating a learned model for component image recognition according to claim 1, wherein the computer collects an image obtained by imaging the imaging target with a camera of a component mounter or a camera of the inspection device during production, as the sample component image.

5. The system for creating a learned model for component image recognition according to claim 1, wherein the reference-learned model and the component-by-component learned model are learned models for determining whether a pickup orientation of the component picked up by the suction nozzle is normal pickup or abnormal pickup.

6. The system for creating a learned model for component image recognition according to claim 1, wherein the reference-learned model and the component-by-component learned model are learned models for determining a presence or absence of the component picked up by the suction nozzle.

7. The system for creating a learned model for component image recognition according to claim 1, wherein the reference-learned model and the component-by-component learned model are learned models for determining a presence or absence of the component mounted on the circuit board.

8. The system for creating a learned model for component image recognition according to claim 1, wherein the computer transfers the created component-by-component learned model to a component mounter or the inspection device that uses the component-by-component learned model.

9. A method for creating a learned model for component image recognition, the learned model being used when performing image recognition by imaging the imaging target with a camera, the imaging target being a component that is picked up by a suction nozzle of a component mounter, or a component that is mounted on a circuit board, the method comprising:
acquiring a reference-learned model to be used for image recognition of a reference component;
collecting sample component images for each type of a component having a predetermined similarity with the reference component;
obtaining information of an inspection result acquired from an inspection device;
calculating a failure occurrence rate for each type of the component based on the information of the inspection result; and
when the failure occurrence rate exceeds a predetermined threshold, creating a component-by-component learned model to be used for image recognition of the component for each type of the component, the component-by-component learned model being created by adding the sample component image acquired for each type of the component as teacher data of the reference-learned model, and re-learning the added sample component image.

* * * * *